(12) United States Patent
Olivadese

(10) Patent No.: US 10,381,708 B2
(45) Date of Patent: Aug. 13, 2019

(54) SUPERCONDUCTING RESONATOR TO LIMIT VERTICAL CONNECTIONS IN PLANAR QUANTUM DEVICES

(71) Applicant: International Business Machines Corporation, Armonk, NY (US)

(72) Inventor: Salvatore Bernardo Olivadese, Yorktown Heights, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 94 days.

(21) Appl. No.: 15/797,777

(22) Filed: Oct. 30, 2017

(65) Prior Publication Data

US 2019/0131685 A1    May 2, 2019

(51) Int. Cl.
*H01P 7/08* (2006.01)
*H01L 39/00* (2006.01)
(Continued)

(52) U.S. Cl.
CPC .............. *H01P 7/086* (2013.01); *B82Y 20/00* (2013.01); *H01L 39/00* (2013.01); *G06N 10/00* (2019.01); *H01B 12/02* (2013.01)

(58) Field of Classification Search
CPC . H01P 7/08–7/088; B82Y 20/00; H01L 39/00
See application file for complete search history.

(56) References Cited

U.S. PATENT DOCUMENTS 4,434,347 A    2/1984   Kurtz et al.
5,338,897 A    8/1994   Tsay et al.
(Continued)

FOREIGN PATENT DOCUMENTS

CN    104050509 A    9/2014
EP    0073172 A2    8/1982

OTHER PUBLICATIONS

R. Versluis et al. "Scalable quantum circuit and control for a superconducting surface code," arXiv preprint arXiv:1612.08208, 2016.
(Continued)

*Primary Examiner* — Dean O Takaoka
*Assistant Examiner* — Alan Wong
(74) *Attorney, Agent, or Firm* — Garg Law Firm, PLLC; Rakesh Garg; Grant Johnson (57) ABSTRACT

A set of superconducting devices is interconnected in a lattice that is fabricated in a single two-dimensional plane of fabrication such that a superconducting connection can only reach a first superconducting device in the set while remaining in the plane by crossing a component of a second superconducting device that is also located in the plane. A superconducting coupling device having a span and a clearance height is formed in the superconducting connection of the first superconducting device. A section of the superconducting coupling device is separated from the component of the second superconducting device by the clearance in a parallel plane. A potential of a first ground plane on a first side of the component is equalized with a second ground plane on a second side of the component using the superconducting coupling device.

25 Claims, 8 Drawing Sheets

(51) Int. Cl.
B82Y 20/00 (2011.01)
*H01B 12/02* (2006.01)
*G06N 10/00* (2019.01)

(56) References Cited

U.S. PATENT DOCUMENTS

| | | | | |
|---|---|---|---|---|
| 7,533,068 | B2* | 5/2009 | Maassen van den Brink | ............ G06F 15/76 706/10 |
| 8,421,053 | B2* | 4/2013 | Bunyk | ................... B82Y 10/00 257/9 |
| 9,183,508 | B2* | 11/2015 | King | ........................ G06F 15/76 |
| 9,219,298 | B2 | 12/2015 | Abraham et al. | |
| 9,524,470 | B1* | 12/2016 | Chow | ..................... H01L 25/04 |
| 9,614,270 | B2 | 4/2017 | Chang et al. | |
| 9,892,365 | B2* | 2/2018 | Rigetti | .................... G06F 13/36 |
| 10,074,056 | B2* | 9/2018 | Epstein | ................. G06N 10/00 |
| 2004/0155235 | A1 | 8/2004 | Mattis | |
| 2006/0043423 | A1 | 3/2006 | Freedman et al. | |
| 2008/0035911 | A1 | 2/2008 | Gilbert et al. | |
| 2017/0061317 | A1 | 3/2017 | Chow et al. | |

OTHER PUBLICATIONS

J. Wenner et al., "Wirebond crosstalk and cavity modes in large chip mounts for superconducting qubits," Superconductor Science and Technology, vol. 24, No. 6, 2011, 065001.
A. Chen et al., "Fabrication and characterization of aluminum airbridges for superconducting microwave circuits," Applied Physics Letters, vol. 104, No. 5, 2014, 052602.
K. L. Denis et al., "Fabrication of Superconducting Vacuum-Gap Crossovers for High Performance Microwave Applications," IEEE Transactions on Applied Superconductivity, vol. 27, No. 4, 2017, 1100404.
M. Abuwasib et al., "Fabrication of large dimension aluminum air-bridges for superconducting quantum circuits." Journal of Vacuum Science & Technology B, vol. 31, No. 3, 2013, 031601.
PCT, International Searching Authority, PCT/IB2017/057895, dated Mar. 30, 2018.

* cited by examiner

$$N = \sqrt{\#Qubits} \qquad \text{Assuming Qubits in a square grid of side } N$$

$$J = D_M \, mod(N, 2) + \sum_{j=1}^{D_M} j[(N - 2j)^2 - (N - 2j - 2)^2]$$

$$D_M = \left\lfloor \frac{N-1}{2} \right\rfloor \qquad \text{Max distance from grid center}$$

$$mod(N, 2) \qquad \text{1 if N even or 0 if N odd}$$

800

US 10,381,708 B2

SUPERCONDUCTING RESONATOR TO LIMIT VERTICAL CONNECTIONS IN PLANAR QUANTUM DEVICES

TECHNICAL FIELD

The present invention relates generally to a superconductor device, a fabrication method, and fabrication system for minimizing off-plane connections in planar superconducting quantum devices. More particularly, the present invention relates to a device, method, and system for superconducting resonator to limit vertical connections in planar quantum devices.

BACKGROUND

Hereinafter, a "Q" prefix in a word of phrase is indicative of a reference of that word or phrase in a quantum computing context unless expressly distinguished where used.

Molecules and subatomic particles follow the laws of quantum mechanics, a branch of physics that explores how the physical world works at the most fundamental levels. At this level, particles behave in strange ways, taking on more than one state at the same time, and interacting with other particles that are very far away. Quantum computing harnesses these quantum phenomena to process information.

The computers we use today are known as classical computers (also referred to herein as "conventional" computers or conventional nodes, or "CN"). A conventional computer uses a conventional processor fabricated using semiconductor materials and technology, a semiconductor memory, and a magnetic or solid-state storage device, in what is known as a Von Neumann architecture. Particularly, the processors in conventional computers are binary processors, i.e., operating on binary data represented in 1 and 0.

A quantum processor (q-processor) uses the odd nature of entangled qubit devices (compactly referred to herein as "qubit," plural "qubits") to perform computational tasks. In the particular realms where quantum mechanics operates, particles of matter can exist in multiple states—such as an "on" state, an "off" state, and both "on" and "off" states simultaneously. Where binary computing using semiconductor processors is limited to using just the on and off states (equivalent to 1 and 0 in binary code), a quantum processor harnesses these quantum states of matter to output signals that are usable in data computing.

Conventional computers encode information in bits. Each bit can take the value of 1 or 0. These 1s and 0s act as on/off switches that ultimately drive computer functions. Quantum computers, on the other hand, are based on qubits, which operate according to two key principles of quantum physics: superposition and entanglement. Superposition means that each qubit can represent both a 1 and a 0 at the same time. Entanglement means that qubits in a superposition can be correlated with each other in a non-classical way; that is, the state of one (whether it is a 1 or a 0 or both) can depend on the state of another, and that there is more information that can be ascertained about the two qubits when they are entangled than when they are treated individually.

Using these two principles, qubits operate as more sophisticated processors of information, enabling quantum computers to function in ways that allow them to solve difficult problems that are intractable using conventional computers. IBM has successfully constructed and demonstrated the operability of a quantum processor using superconducting qubits (IBM is a registered trademark of International Business Machines corporation in the United States and in other countries.)

Superconducting devices such as qubits are fabricated using superconducting and semiconductor materials in known semiconductor fabrication techniques. A superconducting device generally uses one or more layers of different materials to implement the device properties and function. A layer of material can be superconductive, conductive, semiconductive, insulating, resistive, inductive, capacitive, or have any number of other properties. Different layers of materials may have to be formed using different methods, given the nature of the material, the shape, size or placement of the material, other materials adjacent to the material, and many other considerations.

Superconducting devices are often planar, i.e., where the superconductor structures are fabricated on one plane. A non-planar device is a three-dimensional (3D) device where some of the structures are formed above or below a given plane of fabrication.

A q-processor is implemented as a set of more than one qubits. The qubits are fabricated as a lattice of coplanar devices on a single fabrication plane. Such an implementation of a q-processor is generally accepted as a fault-tolerant quantum architecture known as a Surface Code Scheme (SCS) or Surface Code Architecture (SCA).

Figure 1:
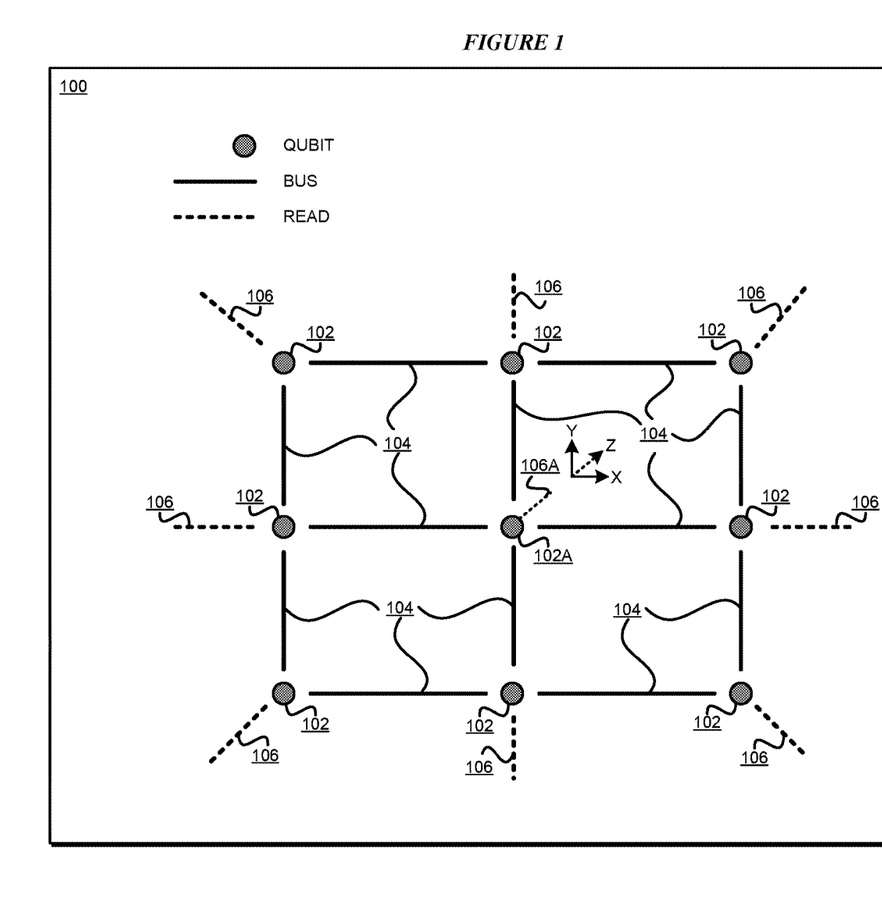
FIG. 1 depicts a block diagram of a network of data processing systems in which illustrative embodiments may be implemented.

FIG. 1 depicts an example Surface Code Architecture illustrating a problem that can be solved using an illustrative embodiment. Superconducting qubit architectures such as SCA 100 arrange a number of qubits 102 and 102A in a lattice formation in a single plane. The qubits are coupled with each other using resonant lines 104 (also known as "bus"). The quantum state of a qubit 102 is read using read lines 106 and 106A.

As can be seen, all resonant lines 104 are coplanar (in the same plane) with qubits 102 and 102A. As recognized by the illustrative embodiments, SCA 100 only allows coplanar read lines 106 to read qubits 102 that lie on the periphery of lattice 100. For qubits, such as qubit 102A, which lie in an inside region of lattice 100, read line 106A has be connected in a plane that is orthogonal to the plane of fabrication of lattice 100. Suppose that the plane of fabrication is the two-dimensional XY plane according to the depicted coordinate axes. Read line 106A has to be fabricated in Z direction, making the fabrication of SCA 100 a three-dimensional fabrication.

This manner of accessing a qubit (102A) for reading the qubit's quantum state is known as "breaking the plane". The illustrative embodiments recognize that breaking the plane due to the need of fabricating non-coplanar read lines (106A) to the non-peripheral qubits (102A) in lattice 100 leads to performance degradation in quantum state measurements, not be mention an increase in the complexity of superconductor fabrication.

A non-peripheral region or area of a lattice is an area located inside a perimeter of the lattice. Generally, in the same plane as the area, the perimeter includes a device, wire, or circuit that will have to be crossed to reach a device located in the area.

A solution is needed such that superconducting devices located in the non-peripheral areas of an SCA lattice can be attached to other circuits without breaking the plane. For example, such a solution would enable coupling qubit 102A and other similarly situated superconducting devices to a coplanar read line and other coplanar bondings on the chip or elsewhere on a circuit board, instead of having to fabricate read line 106A and other similar non-coplanar structures.

SUMMARY

The illustrative embodiments provide a superconducting device, and a method and system of fabrication therefor. A superconducting device of an embodiment includes a set of superconducting devices interconnected in a lattice, wherein the lattice is fabricated in a single two-dimensional plane of fabrication such that a superconducting connection can only reach a first superconducting device in the set while remaining in the plane by crossing a component of a second superconducting device that is also located in the plane. The embodiment further includes a superconducting coupler formed in the superconducting connection of the first superconducting device, the superconducting coupling device having a span and a clearance height, wherein a section of the superconducting coupling device is separated from the component of the second superconducting device by the clearance in a parallel plane. The embodiment further includes a first ground plane on a first side of the component, wherein the superconducting coupling device equalizes a potential of the first ground plane with a potential of a second ground plane on a second side of the component. Thus, the embodiment provides a manner of fabricating a coplanar superconducting quantum processing circuit.

In another embodiment, the superconducting coupler comprises a resonator, and wherein the resonator is formed using a wirebond. Thus, the embodiment provides a particular manner of fabricating a coplanar line connecting to a non-peripherally located superconducting quantum processing device in a lattice of quantum processing devices.

In another embodiment, the superconducting coupler comprises a resonator, and wherein the resonator is formed using a coplanar waveguide. Thus, the embodiment provides a different manner of fabricating a coplanar line connecting to a non-peripherally located superconducting quantum processing device in a lattice of quantum processing devices.

Another embodiment further includes a ground plane coupling between the first ground plane and the second ground plane. Thus, the embodiment provides a structure that equalizes the ground plane potential across a crossed component.

In another embodiment, the ground plane coupling is a superconducting coupling. Thus, the embodiment provides a particular manner of fabricating the structure that equalizes the ground plane potential across a crossed component.

In another embodiment, the ground plane coupling is a superconducting coupling, wherein the superconducting coupler comprises a superconducting resonator, and wherein a shape and a material of the superconducting resonator and the superconducting coupling are same as a shape and a material of the superconducting resonator. Thus, the embodiment provides a different manner of fabricating the structure that equalizes the ground plane potential across a crossed component.

Another embodiment further includes a rising section of the superconducting coupler, wherein the rising section couples one end of the superconducting coupler to one section of the superconducting connection on the first side of the component. The embodiment includes a rejoining section of the superconducting coupler, wherein the rejoining section couples a second end of the superconducting coupler to the second section of the superconducting connection on an opposite side of the component. Thus, the embodiment provides a specific manner of fabricating a coplanar line plane that is substantially parallel to a plane of fabrication of a non-peripherally located superconducting quantum processing device in a lattice of quantum processing devices.

In another embodiment, the clearance at least equals a threshold clearance, and wherein an insulator is formed between the component and the superconducting coupler to create the clearance. Thus, the embodiment provides a manner of electrically and magnetically separating the coplanar line connecting to a non-peripherally located superconducting quantum processing device, from a crossed component in a lattice of quantum processing devices.

In another embodiment, the first superconducting device is a first qubit, wherein the second superconducting device is a second qubit, wherein the superconducting connection of the first superconducting device is a read line of the first qubit, and wherein the component of the second superconducting device is a resonant line of the second qubit. Thus, the embodiment provides a manner of fabricating a lattice of coplanar qubits without using 3D lines.

An embodiment includes a fabrication method for fabricating the superconducting device.

An embodiment includes a fabrication system for fabricating the superconducting device.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

The illustrative embodiments used to describe the invention generally address and solve the above-described problems and other related problems by providing a superconducting resonator to limit vertical connections in planar quantum devices. The illustrative embodiments also provide a fabrication method and system for fabricating a superconducting resonator to limit vertical connections in planar quantum devices.

An embodiment provides a superconducting coupling device, which can be implemented as superconducting wirebond, a coplanar waveguide (CPW), or some combination thereof in superconducting quantum logic circuit. A superconducting coupling device formed in accordance with an illustrative embodiment operates as a resonator (hereinafter referred to as a "coupling resonator").

A wirebond is a conductor formed using a bonding apparatus, to create a superconductive join between two superconducting lines or between a superconducting component and another component on the chip or circuit board. In one embodiment, the wirebond has a round cross-section. A coplanar waveguide is a type of superconducting planar transmission line designed to carry microwave-frequency signals.

Another embodiment provides fabrication method for the coupling resonator, such that the method can be implemented as a software application. The application implementing a fabrication method embodiment can be configured to operate in conjunction with an existing superconducting fabrication system—such as a lithography system.

For the clarity of the description, and without implying any limitation thereto, the illustrative embodiments are described using an example number of qubits arranged in a lattice. An embodiment can be implemented with a different number of qubits, different arrangements in a lattice, a superconducting device other than a qubit, or some combination thereof, within the scope of the illustrative embodiments. An embodiment can be implemented to similarly improve other coplanar superconducting fabrications where a coupling to a superconducting element undesirably breaks the plane.

Furthermore, a simplified diagram of the example coupling resonator is used in the figures and the illustrative embodiments. In an actual fabrication of a coupling resonator, additional structures that are not shown or described herein, or structures different from those shown and described herein, may be present without departing the scope of the illustrative embodiments. Similarly, within the scope of the illustrative embodiments, a shown or described structure in the example coupling resonator may be fabricated differently to yield a similar operation or result as described herein.

Differently shaded portions in the two-dimensional drawing of the example structures, layers, and formations are intended to represent different structures, layers, materials, and formations in the example fabrication, as described herein. The different structures, layers, materials, and formations may be fabricated using suitable materials that are known to those of ordinary skill in the art.

A specific shape, location, position, or dimension of a shape depicted herein is not intended to be limiting on the illustrative embodiments unless such a characteristic is expressly described as a feature of an embodiment. The shape, location, position, dimension, or some combination thereof, are chosen only for the clarity of the drawings and the description and may have been exaggerated, minimized, or otherwise changed from actual shape, location, position, or dimension that might be used in actual lithography to achieve an objective according to the illustrative embodiments.

Furthermore, the illustrative embodiments are described with respect to a specific actual or hypothetical superconducting device, e.g., a qubit, only as an example. The steps described by the various illustrative embodiments can be adapted for fabricating a variety of planar coupling resonators in a similar manner, and such adaptations are contemplated within the scope of the illustrative embodiments. A coupling resonator is depicted as jumping over a single superconducting device only as a non-limiting example. From this disclosure, those of ordinary skill in the art will be able to conceive and fabricate coupling resonators that jump over more than one superconducting devices in a single jump, and such adaptations are contemplated within the scope of the illustrative embodiments. Jumping over a device, in the manner a coupling resonator is fabricated, is considered coplanar with the device even though the coupling resonator follows a path that is elevated from the plane of the fabrication. The coupling resonator is regarded as coplanar because the elevated path is not substantially orthogonal to the plane of fabrication but substantially parallel to the plane of fabrication in at least one section of the coupling resonator and joins back to the plane of fabrication in at least two sections of the coupling resonator.

An embodiment when implemented in an application causes a fabrication process to perform certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

The illustrative embodiments are described with respect to certain types of materials, electrical properties, structures, formations, layers orientations, directions, steps, operations, planes, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

The illustrative embodiments are described using specific designs, architectures, layouts, schematics, and tools only as examples and are not limiting to the illustrative embodiments. The illustrative embodiments may be used in conjunction with other comparable or similarly purposed designs, architectures, layouts, schematics, and tools.

The examples in this disclosure are used only for the clarity of the description and are not limiting to the illustrative embodiments. Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 2:
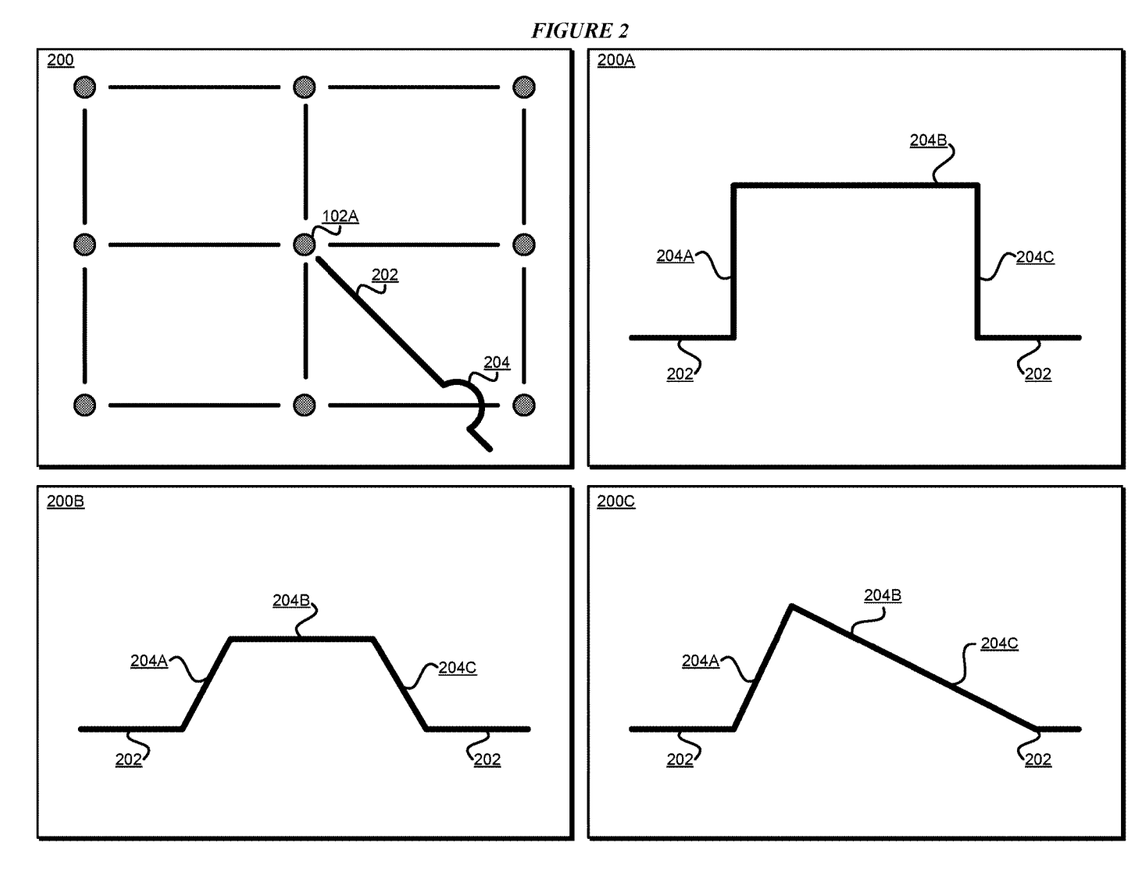
FIG. 2 depicts a block diagram of a data processing system in which illustrative embodiments may be implemented.

With reference to FIG. 2, this figure depicts an example coupling resonator in accordance with an illustrative embodiment. Schematic view 200 shows a portion of lattice 100 of FIG. 1, and includes an improvement imparted by an embodiment.

View 200 depicts a superconducting device, e.g., qubit 102A, that is located in the non-peripheral area of lattice 100. As different from lattice 100, where read line 106A is constructed in Z direction, an embodiment fabricates microwave signal transmission line 202 in the same plane as the plane of qubit 102A (the aforementioned XY plane). In a non-limiting example, line 202 can be a substitute for read line 106A in FIG. 1, and can operate as read line 202 coupled to qubit 102A.

For coplanar fabrication, at or near an area in lattice 100 line 202 has to cross another component (the crossed component) in the same plane, to wit, the XY plane. In such an area, an embodiment fabricates coupling resonator 204. Coupling resonator 204 elevates above the plane by departing from the plane in one section (rising section 204A), running substantially distant from (not necessarily parallel to) the plane in another section (elevated section 204B), and rejoining the plane in a third section (rejoining section 204C). The embodiment positions one or more sections 204A-C of coupling resonator 204 in such a way that at least elevated section 204B jumps over the crossed component. Two or more of sections 204A-C may be combined as a single section (see an example in FIG. 2, diagram 200C).

Jumping over the crossed component means clearing or passing over the crossed component by at least a threshold clearance. In one embodiment, the threshold clearance is at least equal to a distance beyond which a magnetic field created by the crossed component remains effectively undisturbed (is disturbed by a negligible amount) by a magnetic field created by the signals passing through the coupling resonator. In one embodiment, the threshold clearance is a height of an insulating structure fabricated on the XY plane above the crossed component.

Coupling resonator 204 has a span. The span of the coupling resonator is that length of the coupling resonator where every portion of that length is at least the threshold clearance distance away from the crossed component. In one embodiment, the span includes the rising section 204A, elevated section 204B, and rejoining section 204C. In another embodiment the span includes only elevated section 204B and does not include the rising and the rejoining sections 204A and 204C, the difference being in a manner in which the rising and the rejoining sections 204A and 204C are fabricated. Some non-limiting example manners of fabricating the various sections of coupling resonator are depicted in schematic diagrams 200A, 200B, and 200C in this figure.

After rejoining section 204C rejoins the plane, line 202 continues. Any number of coupling resonators 204 may be included in line 202 in a similar manner. Different coupling resonators 204 in a given line 202 may be formed differently from one another—some examples of the possible differences are shown in diagrams 200A, 200B, and 200C.

Figure 3:
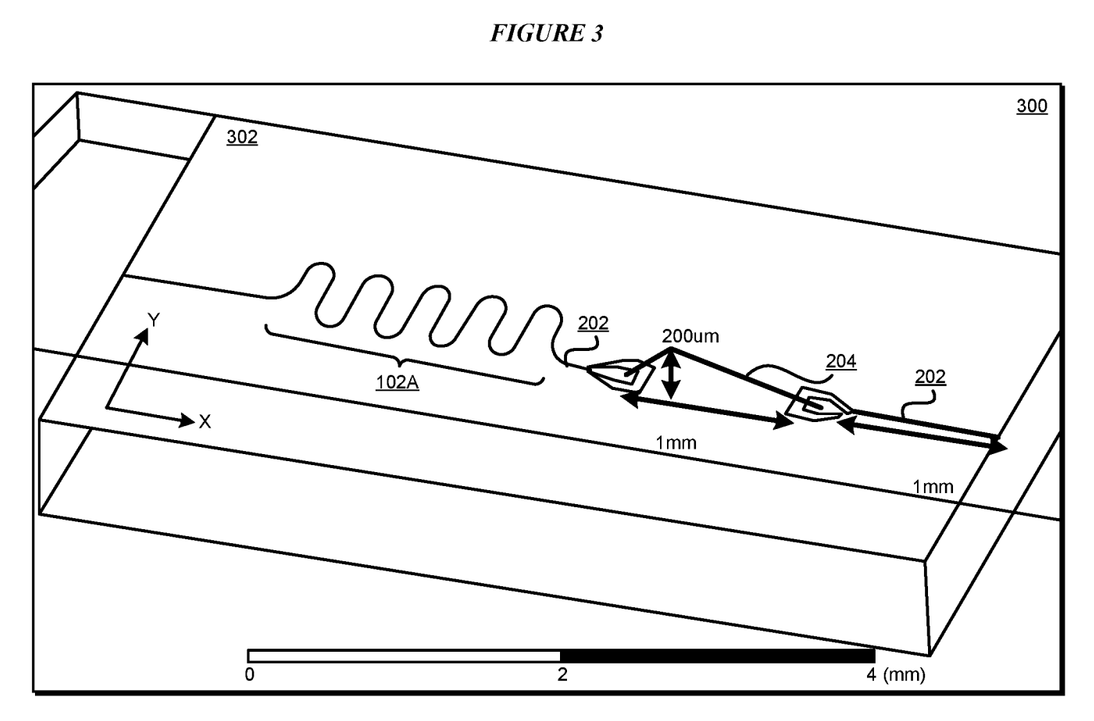
FIG. 3 depicts an example implementation of a coupling resonator in accordance with an illustrative embodiment.

With reference to FIG. 3, this figure depicts an example implementation of a coupling resonator in accordance with an illustrative embodiment. View 300 depicts superconducting chip (or die) 302 in which one or more superconducting devices are fabricated in the XY plane as shown. For example, chip 302 may include lattice 100 from FIG. 1. Superconducting device 102A is qubit 102A in lattice 100. Line 202 may be a read line for qubit 102A. Line 202 begins at qubit 102A, includes a non-limiting manifestation of coupling resonator 204, and continues to a destination (not shown).

Only as a non-limiting example, coupling resonator 204 is depicted in FIG. 3 with a threshold clearance of 200 microns and a span of 1 millimeter (mm). the length of line 202 before and after coupling resonator 204 is immaterial for the purposes of the illustrative embodiments.

Figure 4:
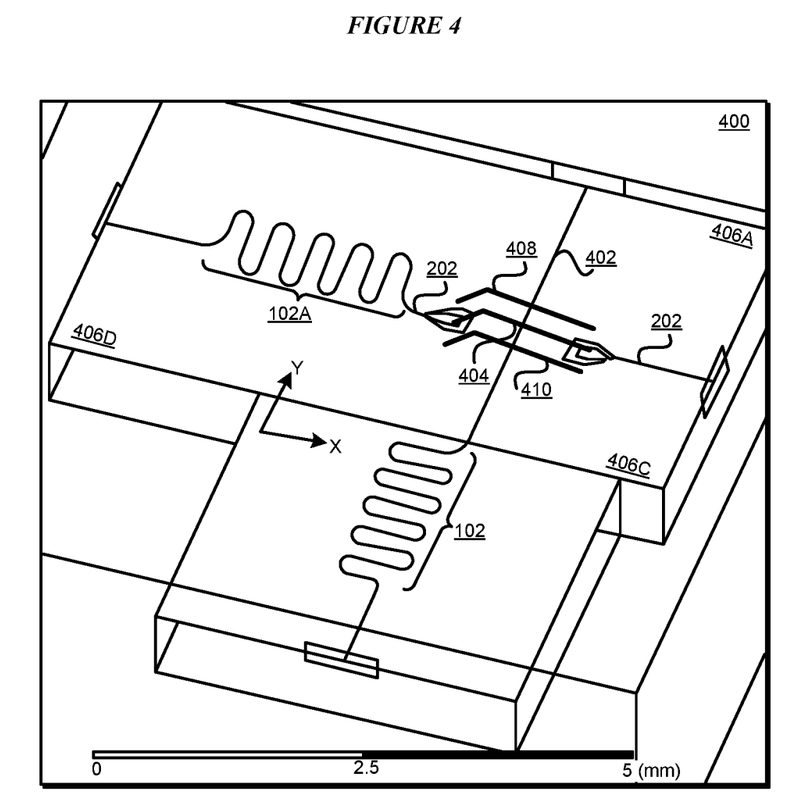
FIG. 4 depicts another example configuration of a coupling resonator in accordance with an illustrative embodiment.

With reference to FIG. 4, this figure depicts another example configuration of a coupling resonator in accordance with an illustrative embodiment. In configuration 400, qubits 102 and 102A participate in lattice 100 in the manner depicted in FIG. 1. Qubit 102A has line 202 as described with respect to FIG. 3. Qubit 102 has line 402, which can be a resonant line 104 or a read line 106 associated with qubit 102, depending on the particular fabrication. Line 402 forms a crossed component for coupling resonator 404. Coupling resonator 404 is an example of coupling resonator 204 depicted in FIG. 3.

Lines 202 and 402 divide the fabrication plane into ground planes 406A, 406B, 406C, and 406D as shown. The signal and potential (voltage) of ground planes (collectively referred to as "potential of ground plane") across crossed component 402 has to be equalized. This equalization has to be performed on either side of line 202 which includes coupling resonator 404. For example, the potential of ground plane 406A has to be equalized with the potential of ground plane 406B, and the potential of ground plane 406C has to be equalized with the potential of ground plane 406D.

For equalization of ground plane potential in this manner, coupling resonator 404 includes additional superconducting couplings. In one embodiment, superconducting coupling 408 is formed to equalize the potential of ground planes 406A and 406B, and superconducting coupling 410 is formed to equalize the potential of ground planes 406C and 406D. In one embodiment, couplings 408 and 410 are fabricated using substantially the same method and materials as coupling resonator 404.

Couplings 408 and 410 can each include a rising section similar to section 204A, an elevated section similar to section 204B, and a rejoining section similar to section 204C. One or more of the rising section, elevated section, and rejoining section of coupling 408 may be combined. Similarly, one or more of the rising section, elevated section, and rejoining section of coupling 410 may be combined.

While only four ground planes 406A-D are depicted, an implementation might create more than four ground planes by laying out various components differently than shown. Accordingly, potential equalization may be needed across more than two pairs of ground planes. Couplings similar to couplings 408 and/or 410 can be fabricated in a manner described herein to equalize the potentials across as many ground plane pairs as an implementation may require. Coupling 408 may be fabricated differently from coupling 410, e.g., by using a different fabrication method, superconducting material, sections, sizes, clearances, spans, or some combination thereof.

Figure 5:
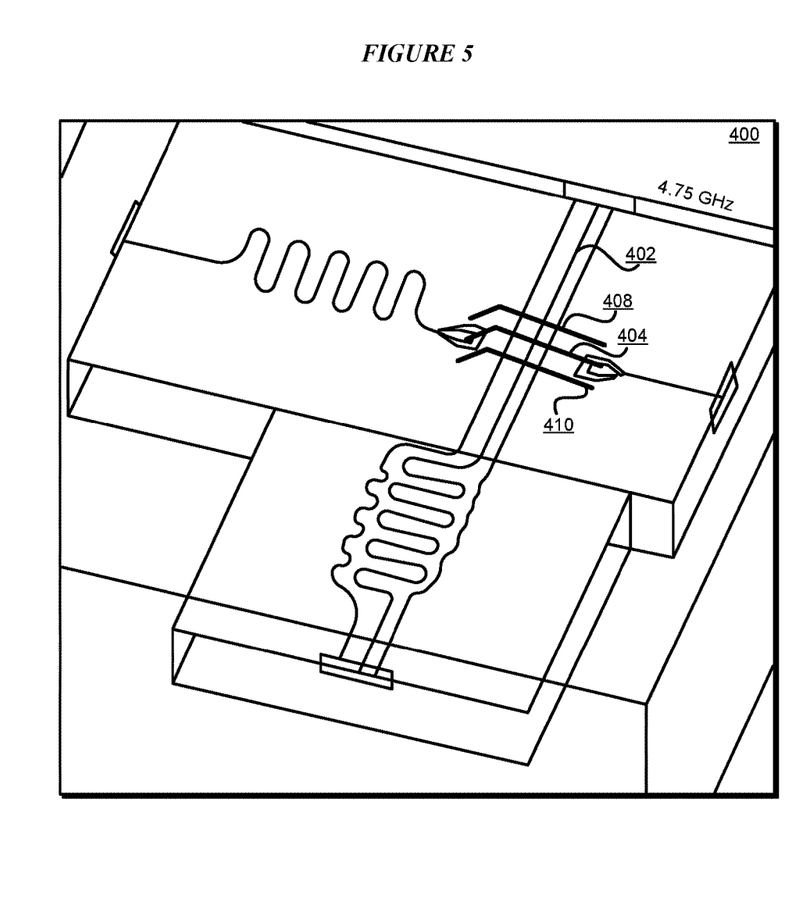
FIG. 5 depicts a simulation result from using a coupling resonator in accordance with an illustrative embodiment.

With reference to FIG. 5, this figure depicts a simulation result from using a coupling resonator in accordance with an illustrative embodiment. Configuration 400 of FIG. 4 is used in the simulation. An e-field simulation at resonance confirms that coupling resonator 404 together with couplings 408 and 410 does not interfere with an approximately 2.07 e+02 dB field, which is generated by a 4.75 Gigahertz (GHz) signal on line 402 from qubit 102. In other words, coupling resonator 404 together with couplings 408 and 410 does not distort the field in any significant way.

Figure 6:
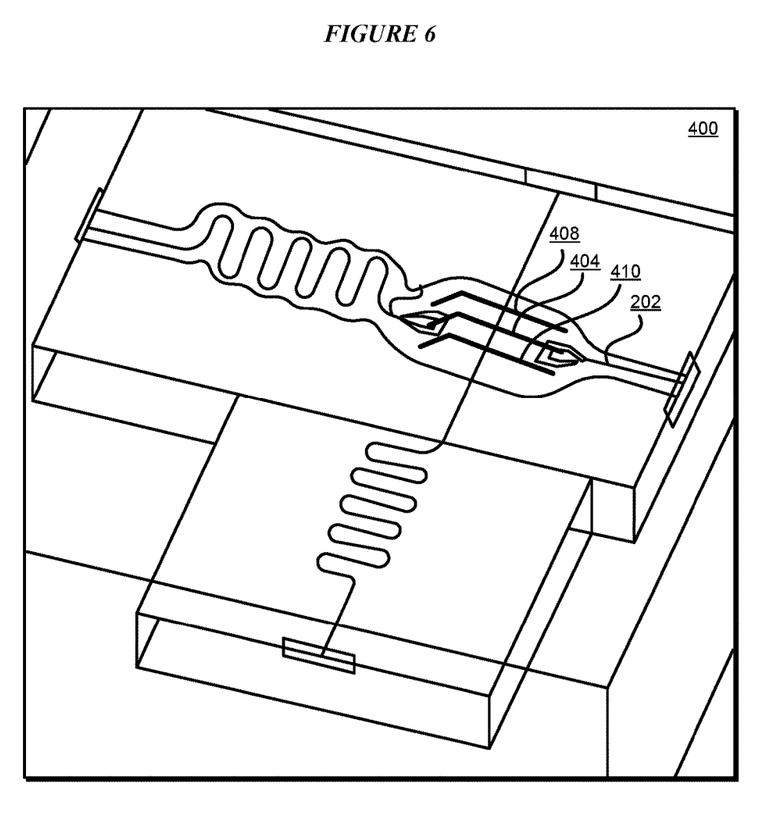
FIG. 6 depicts another simulation result from using a coupling resonator in accordance with an illustrative embodiment.

With reference to FIG. 6, this figure depicts another simulation result from using a coupling resonator in accordance with an illustrative embodiment. Configuration 400 of FIG. 4 is used in the simulation. An e-field simulation at resonance confirms that coupling resonator 404 together with couplings 408 and 410 does not distort or cause a loss in an approximately 1.15 e+02 dB field, which is generated by a 5.2 GHz signal on line 202 from qubit 102A.

Figure 7:
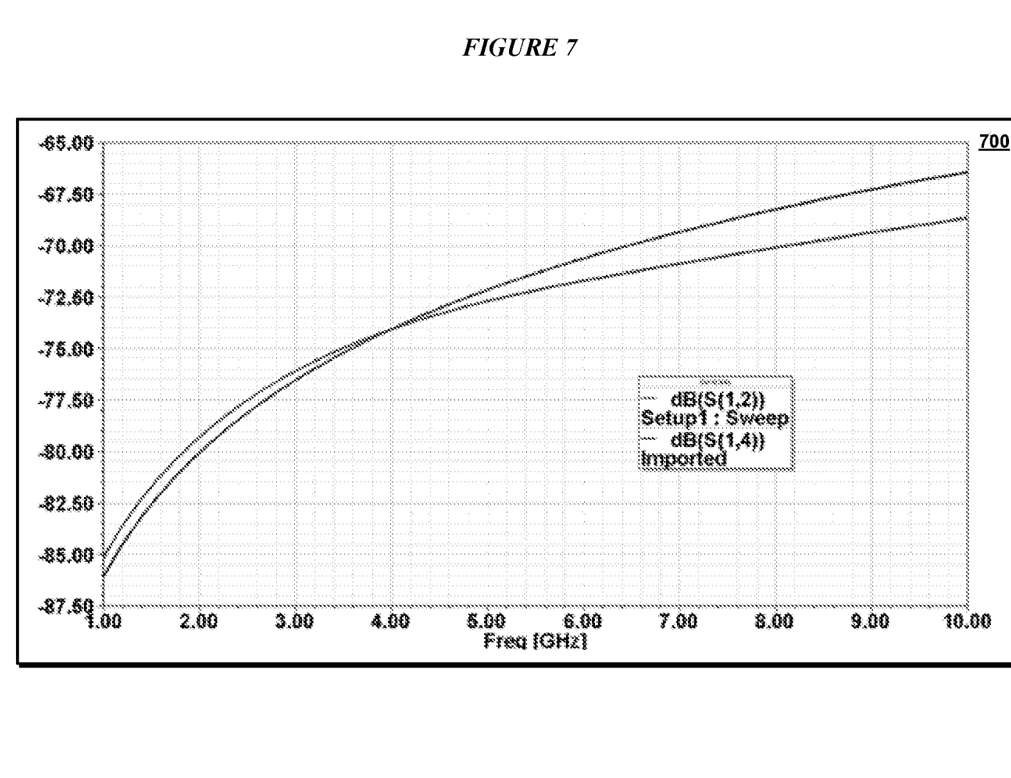
FIG. 7 depicts another simulation result from using a coupling resonator in accordance with an illustrative embodiment.

With reference to FIG. 7, this figure depicts another simulation result from using a coupling resonator in accordance with an illustrative embodiment. Graph 700 demonstrates that the magnetic cross-talk between coupling resonator 404 together with couplings 408 and 410, and crossed component 402 is well below an acceptable threshold of −50 dB under two different measurement setups.

Figure 8:
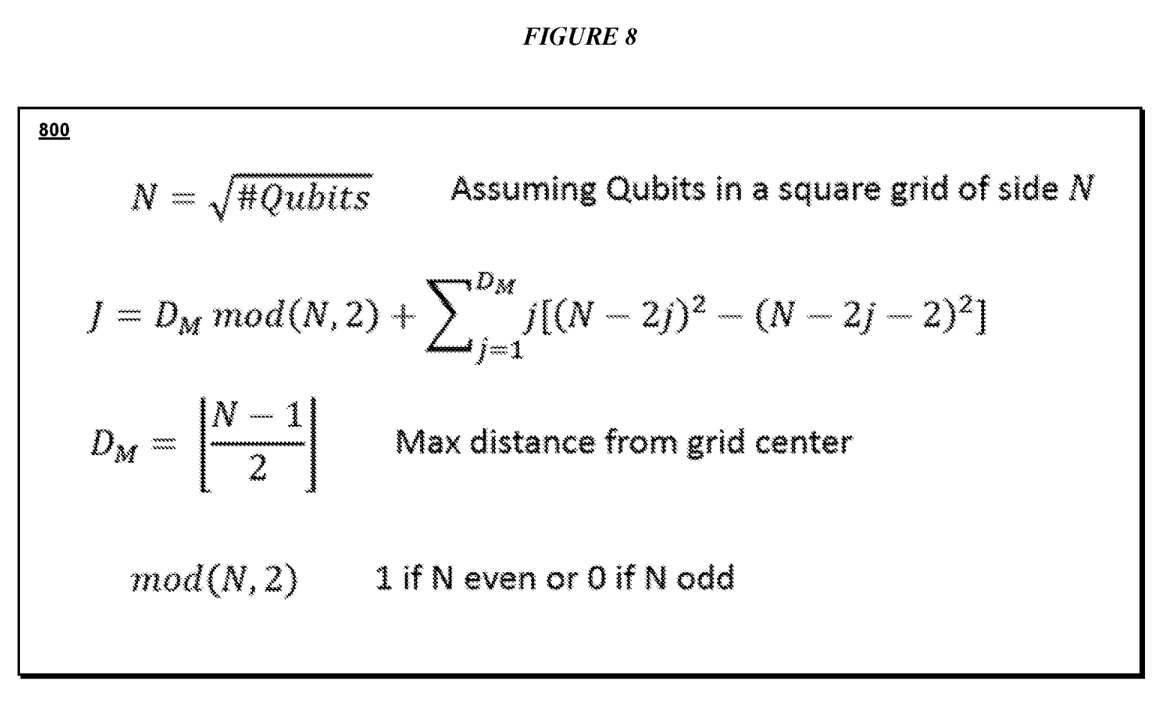
FIG. 8 depicts a set of equations to compute a number of jumps needed in a lattice in accordance with an illustrative embodiment.

With reference to FIG. 8, this figure depicts a set of equations to compute a number of jumps needed in a lattice in accordance with an illustrative embodiment. Set 800 of equations assumes a square lattice, each side of the lattice having N qubits. Set 800 provides the number of jumps J that will be needed in the lattice. Specifically, J comprises a number of coupling resonators (assuming that corresponding couplings for potential ground plane equalizations are included with the coupling resonators) that are needed in the lattice such that no non-peripheral qubit requires a 3D fabrication of a line.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "illustrative" is used herein to mean "serving as an example, instance or illustration." Any embodiment or design described herein as "illustrative" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A superconducting coupling device comprising:
   a set of superconducting devices interconnected in a lattice, wherein the lattice is fabricated in a single two-dimensional plane of fabrication such that a superconducting connection can only reach a first superconducting device in the set while remaining in the plane by crossing a component of a second superconducting device that is also located in the plane;
   a superconducting coupler formed in the superconducting connection of the first superconducting device, the superconducting coupling device having a span and a clearance height, wherein a section of the superconducting coupling device is separated from the component of the second superconducting device by the clearance in a parallel plane; and
   a first ground plane on a first side of the component, wherein the superconducting coupling device equalizes a potential of the first ground plane with a potential of a second ground plane on a second side of the component.

2. The superconducting coupling device of claim 1, wherein the superconducting coupler comprises a resonator, and wherein the resonator is formed using a wirebond.

3. The superconducting coupling device of claim 1, wherein the superconducting coupler comprises a resonator, and wherein the resonator is formed using a coplanar waveguide.

4. The superconducting coupling device of claim 1, further comprising:
   a ground plane coupling between the first ground plane and the second ground plane.

5. The superconducting coupling device of claim 4, wherein the ground plane coupling is a superconducting coupling.

6. The superconducting coupling device of claim 4, wherein the ground plane coupling is a superconducting coupling, wherein the superconducting coupler comprises a superconducting resonator, and wherein a shape and a material of the superconducting resonator and the superconducting coupling are same as a shape and a material of the superconducting resonator.

7. The superconducting coupling device of claim 1, further comprising:
   a rising section of the superconducting coupler, wherein the rising section couples one end of the superconducting coupler to one section of the superconducting connection on the first side of the component; and a rejoining section of the superconducting coupler, wherein the rejoining section couples a second end of the superconducting coupler to the second section of the superconducting connection on an opposite side of the component.

8. The superconducting coupling device of claim 1, wherein the clearance at least equals a threshold clearance, and wherein an insulator is formed between the component and the superconducting coupler to create the clearance.

9. The superconducting coupling device of claim 1, wherein the first superconducting device is a first qubit, wherein the second superconducting device is a second qubit, wherein the superconducting connection of the first superconducting device is a read line of the first qubit, and wherein the component of the second superconducting device is a resonant line of the second qubit.

10. A method comprising:
    interconnecting a set of superconducting devices in a lattice, wherein the lattice is fabricated in a single two-dimensional plane of fabrication such that a superconducting connection can only reach a first superconducting device in the set while remaining in the plane by crossing a component of a second superconducting device that is also located in the plane;
    forming, in the superconducting connection of the first superconducting device a superconducting coupling device, the superconducting coupling device having a span and a clearance height, wherein a section of the superconducting coupling device is separated from the component of the second superconducting device by the clearance in a parallel plane; and
    equalizing, using the superconducting coupling device, a potential of a first ground plane on a first side of the component with a second ground plane on a second side of the component.

11. The method of claim 10, wherein the superconducting coupling device comprises a resonator, and wherein the resonator is formed using a wirebond.

12. The method of claim 10, wherein the superconducting coupling device comprises a resonator, and wherein the resonator is formed using a coplanar waveguide.

13. The method of claim 10, further comprising:
    forming, as a part of forming the superconducting coupling device, a ground plane coupling between the first ground plane and the second ground plane.

14. The method of claim 13, wherein the ground plane coupling is a superconducting coupling.

15. The method of claim 13, wherein the ground plane coupling is a superconducting coupling, wherein the superconducting coupling device further comprises a superconducting resonator, and wherein the superconducting resonator and the superconducting coupling are formed using different superconducting materials.

16. The method of claim 10, further comprising:
    forming a rising section of the coupling resonator, wherein the rising section couples one end of the coupling resonator to one section of the superconducting connection on the first side of the component; and
    forming a rejoining section of the superconducting coupling device, wherein the rejoining section couples a second end of the superconducting coupling device to the second section of the superconducting connection on an opposite side of the component.

17. The method of claim 10, wherein the clearance at least equals a threshold clearance, and wherein an insulator is formed between the component and the superconducting coupling device to create the clearance.

18. The method of claim 10, wherein the first superconducting device is a first qubit, wherein the second superconducting device is a second qubit, wherein the superconducting connection of the first superconducting device is a read line of the first qubit, and wherein the component of the second superconducting device is a resonant line of the second qubit.

19. A superconductor fabrication system comprising a lithography component, the superconductor fabrication system when operated on a die to fabricate a superconductor device performing operations comprising:
    interconnecting a set of superconducting devices in a lattice, wherein the lattice is fabricated in a single two-dimensional plane of fabrication such that a superconducting connection can only reach a first superconducting device in the set while remaining in the plane by crossing a component of a second superconducting device that is also located in the plane;
    forming, in the superconducting connection of the first superconducting device a superconducting coupling device, the superconducting coupling device having a span and a clearance height, wherein a section of the superconducting coupling device is separated from the component of the second superconducting device by the clearance in a parallel plane; and
    equalizing, using the superconducting coupling device, a potential of a first ground plane on a first side of the component with a second ground plane on a second side of the component.

20. The superconductor fabrication system of claim 19, wherein the superconducting coupling device comprises a resonator, and wherein the resonator is formed using a wirebond.

21. The superconductor fabrication system of claim 19, wherein the superconducting coupling device comprises a resonator, and wherein the resonator is formed using a coplanar waveguide.

22. The superconductor fabrication system of claim 19, further comprising:
    forming, as a part of forming the superconducting coupling device, a ground plane coupling between the first ground plane and the second ground plane.

23. The superconductor fabrication system of claim 22, wherein the ground plane coupling is a superconducting coupling.

24. The superconductor fabrication system of claim 22, wherein the ground plane coupling is a superconducting coupling, wherein the superconducting coupling device further comprises a superconducting resonator, and wherein the superconducting resonator and the superconducting coupling are formed using different superconducting materials.

25. The superconductor fabrication system of claim 19, further comprising:
    forming a rising section of the coupling resonator, wherein the rising section couples one end of the coupling resonator to one section of the superconducting connection on the first side of the component; and
    forming a rejoining section of the superconducting coupling device, wherein the rejoining section couples a second end of the superconducting coupling device to the second section of the superconducting connection on an opposite side of the component.

* * * * *